United States Patent
Bapat

(10) Patent No.: US 7,710,168 B2
(45) Date of Patent: May 4, 2010

(54) APPARATUS AND METHOD FOR TWO TIER OUTPUT STAGE FOR SWITCHING DEVICES

(75) Inventor: Sumant Bapat, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 66 days.

(21) Appl. No.: 11/893,879

(22) Filed: Aug. 17, 2007

(65) Prior Publication Data

US 2009/0045860 A1 Feb. 19, 2009

(51) Int. Cl.
*H03B 1/00* (2006.01)
*H03K 3/00* (2006.01)

(52) U.S. Cl. .................. 327/108; 327/112; 327/170; 326/82; 326/83

(58) Field of Classification Search ......... 327/108–112, 327/170, 427, 434; 326/82–88
See application file for complete search history.

(56) References Cited

U.S. PATENT DOCUMENTS

| | | | |
|---|---|---|---|
| 5,717,343 A * | 2/1998 | Kwong | 326/27 |
| 6,160,416 A * | 12/2000 | Adduci et al. | 326/21 |
| 6,265,892 B1 * | 7/2001 | Jou et al. | 326/27 |
| 6,335,638 B1 * | 1/2002 | Kwong et al. | 326/83 |
| 6,624,672 B2 * | 9/2003 | Confaloneri et al. | 327/112 |
| 6,914,457 B2 * | 7/2005 | Confalonieri et al. | 327/108 |
| 6,924,669 B2 * | 8/2005 | Itoh et al. | 326/87 |

* cited by examiner

*Primary Examiner*—Lincoln Donovan
*Assistant Examiner*—Patrick O'Neill
(74) *Attorney, Agent, or Firm*—Darby & Darby PC; Matthew M. Gaffney

(57) ABSTRACT

A circuit for reducing EMI is provided. The circuit includes driver circuitry that drives a power switch, such as a power MOSFET. The power switch provides an output voltage. The circuit decreases the drive strength by which the power switch is driven during each output edge (i.e. when the output goes from low to high (rising edge) or high to low (falling edge)), and returns the drive strength to its normal level when the output edge is complete or approximately complete. Reducing the drive strength of the driver circuitry causes the output edge to occur over a longer period of time. This results in reduction of the EMI of the device.

16 Claims, 13 Drawing Sheets

US 7,710,168 B2

APPARATUS AND METHOD FOR TWO TIER OUTPUT STAGE FOR SWITCHING DEVICES

FIELD OF THE INVENTION

The invention is related to power switches, and in particular but not exclusively, to a method and circuit for reducing the electromagnetic interference (EMI) of power switches by reducing the drive strength of the driver for the power switching during output edges.

BACKGROUND OF THE INVENTION

In audio applications, a power amplifier is usually incorporated to drive a speaker load. The speaker load value typically varies from 4 ohm to 32 ohm. Traditionally, class AB amplifiers have been used to drive the speaker load.

The main drawback of using class AB amplifiers is low efficiency. Low efficiency translates into more power dissipation inside the amplifier which in turn mandates using a (larger) heat sink to dissipate the heat and also lowers the battery life or necessitates a larger and more expensive power supply. This increases the cost and the area of the audio solution.

A class-D amplifier is attractive because of the higher power efficiency compared to a class AB amplifier, which realizes a longer battery life and eliminates the heat sink requirement. This allows design of compact and low cost multi-channel high-power systems. The class D amplifiers partially mitigate the concern of thermal runaway by using transistors as switches.

Class D amplifiers typically employ either pulse-width modulation, pulse density modulation, or sigma-delta modulation. The relatively high frequency carrier signal is modulated by the relatively low frequency audio input signal.

BRIEF DESCRIPTION OF THE DRAWINGS

Non-limiting and non-exhaustive embodiments of the present invention are described with reference to the following drawings, in which.

DETAILED DESCRIPTION

Figure 1:
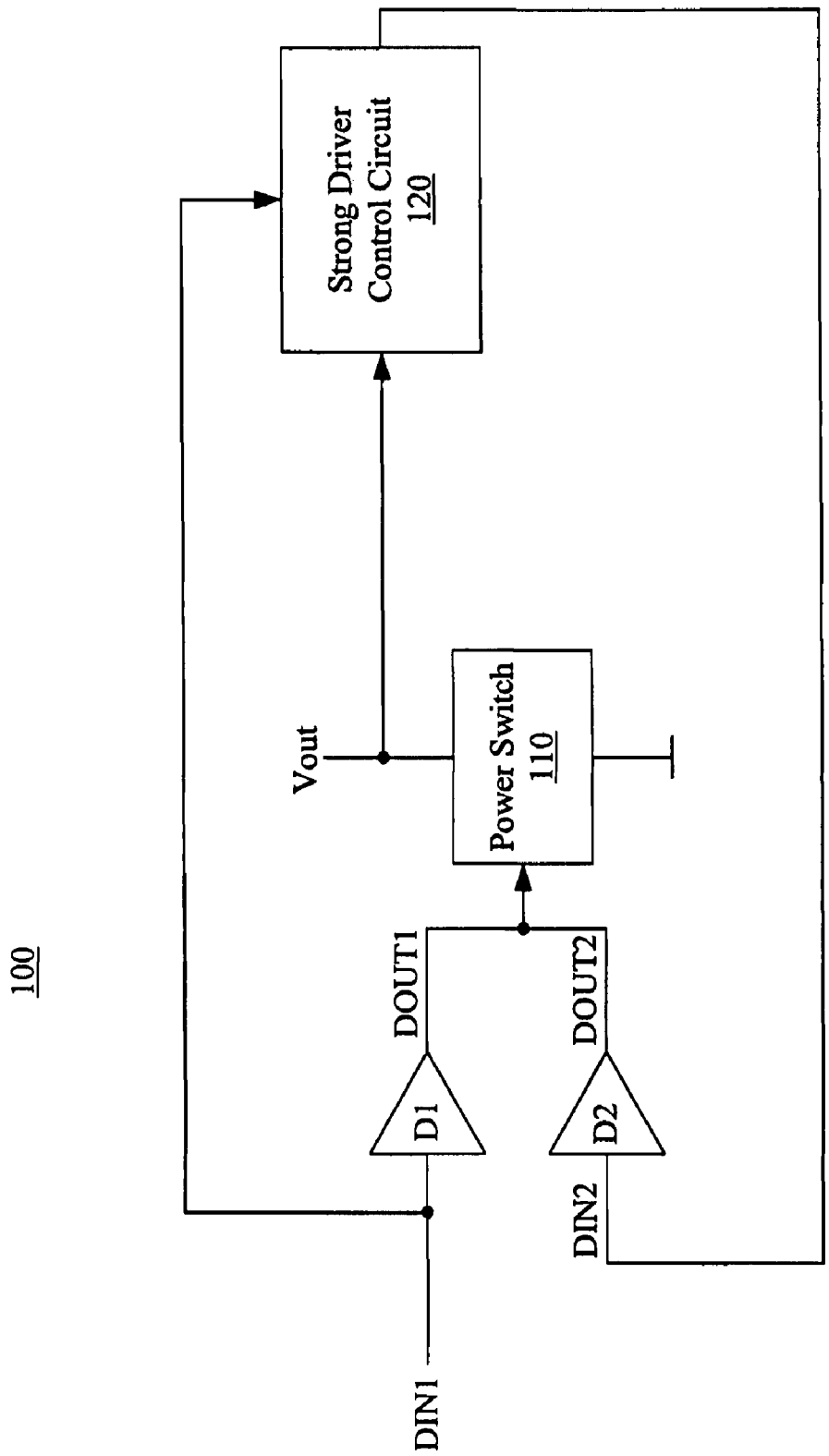
FIG. 1 shows a block diagram of an embodiment of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a circuit for reducing EMI. The circuit includes driver circuitry that drives a power switch, such as a power MOSFET. The power switch provides an output voltage. The circuit decreases the drive strength by which the power switch is driven during each output edge (i.e. when the output goes from low to high (rising edge) or high to low (falling edge)), and returns the drive strength to its normal level when the output edge is complete or approximately complete. Reducing the drive strength of the driver circuitry causes the output edge to occur over a longer period of time. This results in reduction of the EMI of the device.

FIG. 1 shows a block diagram of an embodiment of circuit 100. Circuit 100 includes driver D1, driver D2, power switch 110, and strong driver control circuit 120.

Power switch 110 is a switch that is a power MOSFET or other device suitable for use as a power switch. Further, driver D1 and driver D2 are arranged to drive power switch 110. The drive strength by which power switch 110 is driven (i.e. the current that drives the capacitance of the control node (e.g. gate capacitance) of power switch 110) is stronger when driver D1 and D2 are both driving power switch 110. Also, driver D1 is a relatively weak driver. In one embodiment, driver D2 is a significantly stronger driver than driver D1. Driver D1 is arranged to receive driver input signal DIN1, and to provide signal DOUT1 to drive power switch 110. Similarly, driver D2 is arranged to receive driver input signal DIN2, and to provide signal DOUT2 to drive power switch 110. Power switch 110 controls the value of Vout based on whether power switch 110 is open, closed, or partially open or closed.

Figure 12:
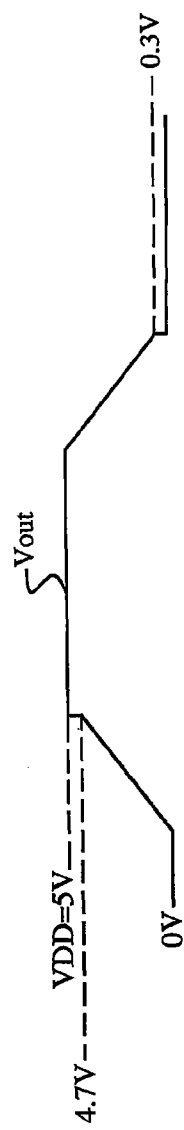
FIG. 12 shows a timing diagram of a waveform of an embodiment of the signal of FIG. 5A.

During normal operation, when power switch 110 is closed, both driver D1 and driver D2 drive power switch 110, so that power switch 110 is driven at its normal level. Further, strong driver control circuit 120 is arranged to control driver input signal DIN2 so that, when power switch 110 first begins to transition from an open switch to a closed switch, driver circuit D2 does not drive power switch 110. In this embodiment, when power switch 110 first begins to transition from an open switch to a closed switch, the transition is driven only by relatively weak driver D1. However, strong driver control circuit 120 is arranged to cause driver D2 to begin driving power switch 110 also when output voltage Vout reaches a pre-determined voltage level. In one embodiment, for a rising edge, driver D2 begins driving power switch 110 also when Vout reaches VDD. In another embodiment, for a rising edge, driver D2 begins driving power switch 110 also when Vout reaches a voltage that is relatively close to VDD(e.g. VDD-300 mV, as shown in FIG. 12 in one embodiment). In one embodiment, for a falling edge, driver D2 begins driving power switch 110 also when Vout reaches 0V. In another embodiment, for a falling edge, driver D2 begins driving power switch 110 also when Vout reaches a voltage that is relatively close to 0V (e.g. 300 mV, as shown in FIG. 12 in one embodiment). The example of 300 mV is given by way of example only; other suitable relatively small voltages may also be employed.

Figure 2:
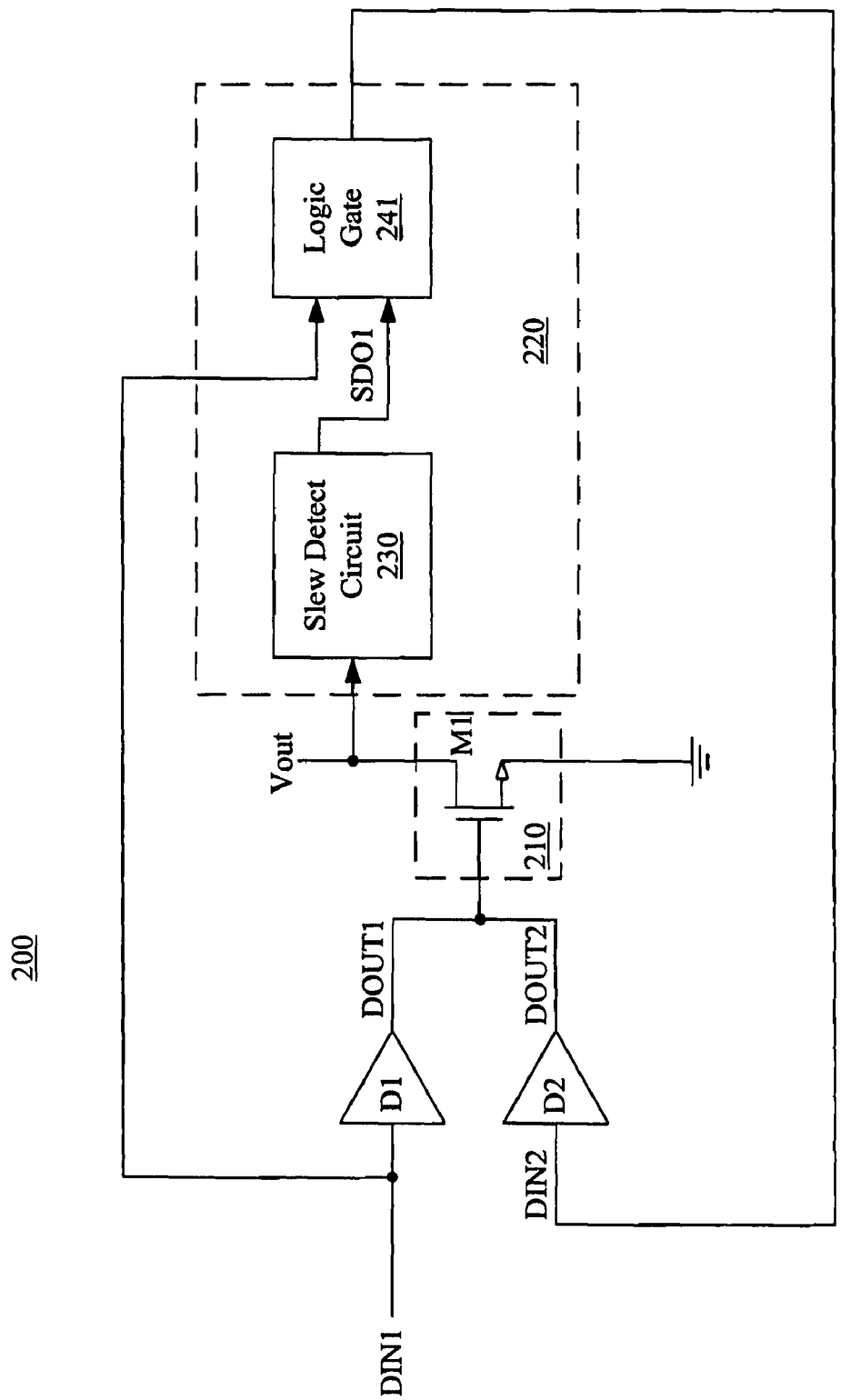
FIG. 2 illustrates a block diagram of an embodiment of the circuit of FIG. 1 that includes a power NMOSFET as a power switch.

FIG. 2 illustrates a block diagram of an embodiment of circuit 200, which may be employed as an embodiment of circuit 100 of FIG. 1. Power switch 210 includes power MOSFET M1. Strong driver control circuit 220 includes slew detect circuit 230 and logic gate 241.

Slew detect circuit 230 is arranged to provide slew detect circuit output signal SDO1 from output voltage Vout. Logic gate 241 is arranged to provide signal DIN2 from signal DIN1 and signal SDO1.

Figures 10A, 10B, 10C:
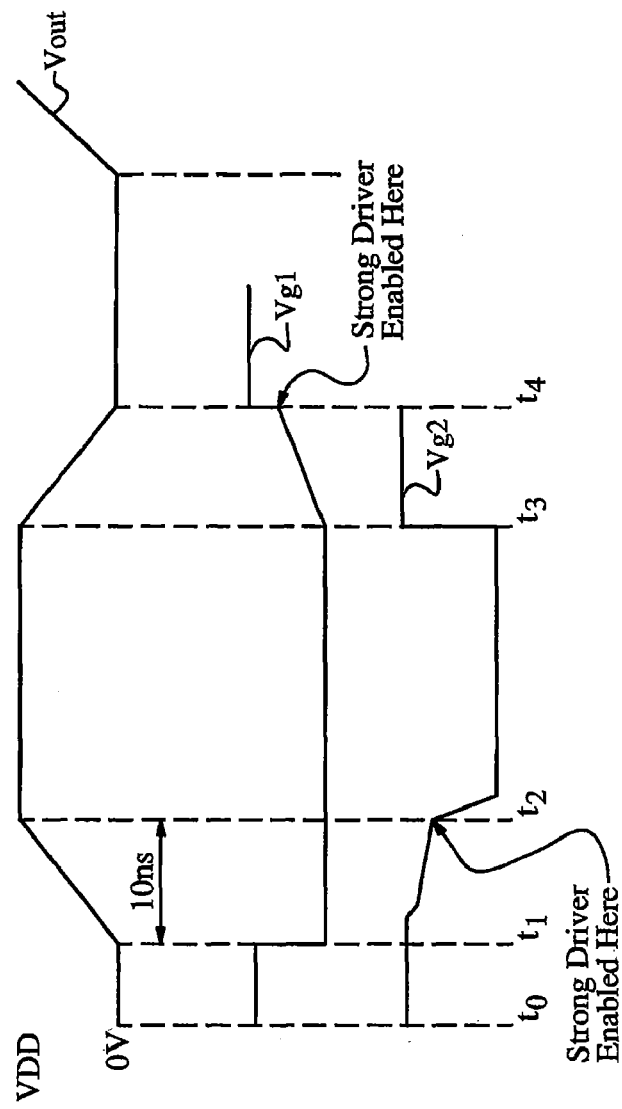
FIGS. 10A-C illustrates timing diagrams of waveforms of embodiments of the signals of FIGS. 5A-5C.

When signal DIM1 is low, signals DOUT1 and DOUT2 are low, causing power MOSFET M1 to be open. When power MOSFET M1 is open, voltage Vout is pulled up to VDD (by circuitry not shown in FIG. 2). When signal DIN1 changes from low to high, signal DOUT1 changes from 0V to Vtn (where Vtn is threshold voltage of power MOSFET M1), and driver D1 drives M1 on. However, strong driver control circuit 220 provides signal DIN2 so that driver D2 is still off. Accordingly, only driver D1 is driving power MOSFET M1 when signal DIN1 first changes from low to high. This causes Vout to transition from VDD to 0V relatively slowly. For example, in one embodiment, this falling edge in signal Vout occurs over about ten nanoseconds (as shown in FIG. 10A in one embodiment), whereas the falling edge would occur in less than one nanosecond if both driver D1 and driver D2 were driving power MOSFET M1 during the falling edge.

By driving only with driver D1, Vout transitions toward 0V relatively slowly. When Vout reaches a pre-determined voltage, signal SDO1 is asserted, which in turns causes logic gate 241 to change signal DIN2 to high. In one embodiment, the pre-determined voltage is 0V, so that drivers D1 and D2 both begin driving power MOSFET M1 on when output voltage Vout reaches ground. In other embodiments, the pre-determined voltage is a voltage slightly greater than 0V (e.g. 300 mV), so that drivers D1 and D2 both begin driving power MOSFET M1 on when output voltage Vout has almost reached ground.

By using only driver D1 to drive power MOSFET M1 on during a falling edge in output voltage Vout, the falling output edge is slowed, and EMI is reduced. However, once the falling edge is complete or almost complete, driver D1 and D2 are both used. If only driver D1 were used to drive power MOSFET M1, the gate of power MOSFET M1 would take very long time in reaching VDD and during this time power MOSFET M1 would only be partially on with relatively high Rdson. This would have significant degrading effect on the specifications of the device such as efficiency, THD, PSRR, and the like. However, once the falling edge is complete or almost complete, driver D1 and D2 are both used, so that the Rdson of power MOSFET M1 and other circuit parameters are not adversely affected by lack of drive strength in driving power MOSFET M1.

In various embodiments, the logic for various components may be reversed from that stated above. For example, in one embodiment, driver D1 provides signal DOUT1 such that it is the same logic level as DIN1, as discussed in the example above. In other embodiments, driver D1 may provide signal DOUT1 with the opposite logic level as signal DIN1. These embodiments and others are within the scope and spirit of the invention.

Figure 3:
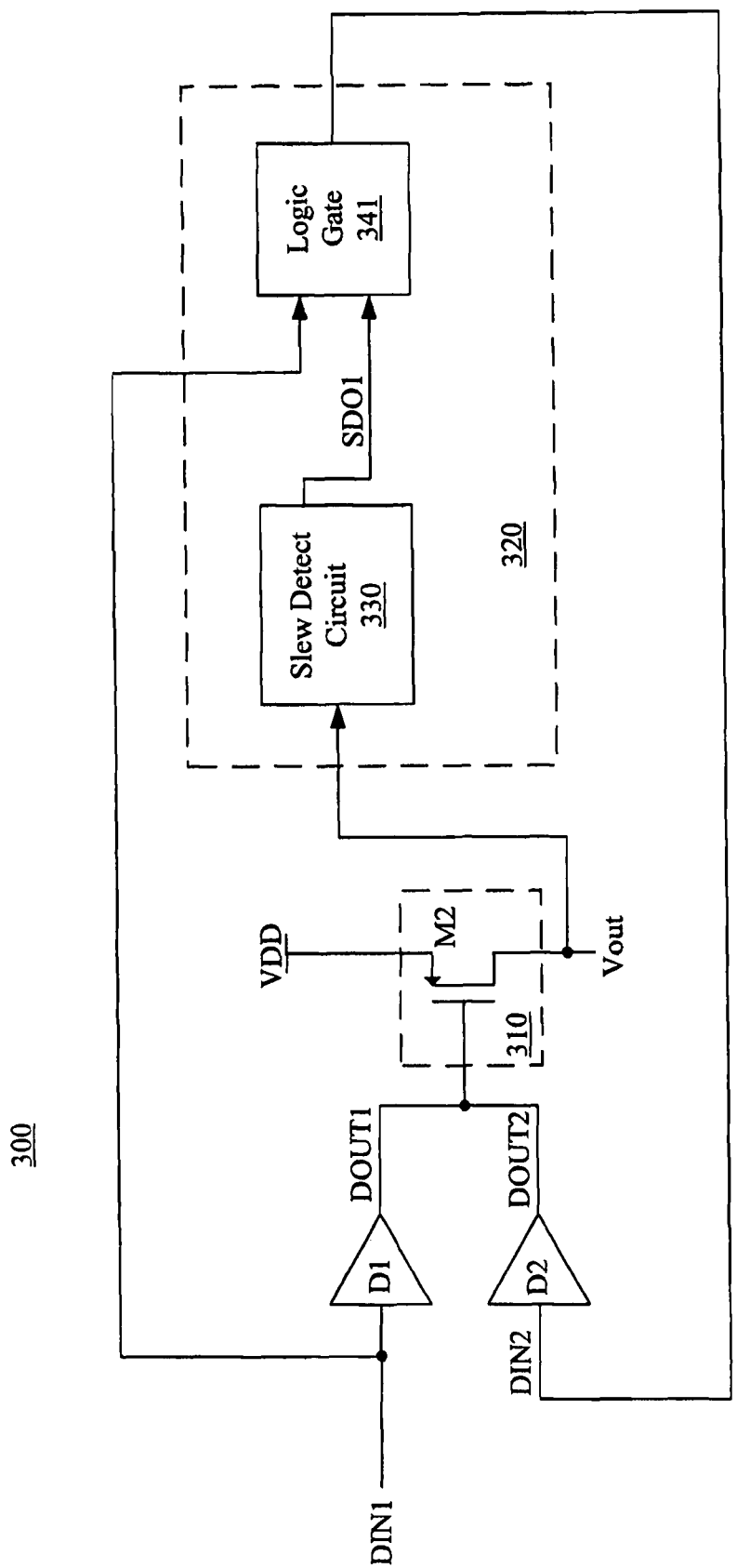
FIG. 3 shows a block diagram of an embodiment of the circuit of FIG. 1 that includes a power PMOSFET as a power switch.

FIG. 3 illustrates a block diagram of an embodiment of the circuit 300, which may be employed as an embodiment of circuit 100 of FIG. 1. Power switch 310 includes power MOSFET M2.

When signal DIN1 is high, signals DOUT1 and DOUT2 are high, causing power MOSFET M2 to be open. When power MOSFET M2 is open, voltage Vout is pulled down to ground (by circuitry not shown in FIG. 3). When signal DIN1 changes from high to low, signal DOUT1 changes from Vdd to Vdd-Vtp (where Vtp is the threshold voltage of the power MOSFET M2), and driver D1 drives M2 on. However, strong driver control circuit 320 provides signal DIN2 so that driver D2 is still off. Accordingly, only driver D1 is driving power MOSFET M2 when signal DIN1 first changes from high to low. This causes Vout to transition from 0V to VDD relatively slowly.

When Vout reaches a pre-determined voltage, signal SDO1 is asserted, which in turn causes logic gate 241 to change signal DIN2 to low. In one embodiment, the pre-determined voltage is VDD, so that drivers D1 and D2 both begin driving power MOSFET M2 on when output voltage Vout reaches VDD. In other embodiments, the pre-determined voltage is a voltage slightly less than VDD (e.g. VDD-300 mV), so that drivers D1 and D2 both begin driving power MOSFET M2 on when output voltage Vout has almost reached VDD.

By using only driver D1 to drive power MOSFET M2 on during a rising edge in output voltage Vout, the rising output edge is slowed, and EMI is reduced. However, once the rising edge is complete or almost complete, driver D1 and D2 are both used. If only driver D1 were used to drive power MOSFET M2, the gate of power MOSFET M2 would take very long time in reaching 0 V and during this time power MOSFET M2 would only be partially on with relatively high Rdson. This would have significant degrading effect on the specifications of the device such as efficiency, THD, PSRR, and the like. However, once the rising edge is complete or almost complete, driver D1 and D2 are both used, so that the Rdson of power MOSFET M2 and other circuit parameters are not adversely affected by lack of drive strength in driving power MOSFET M2.

Figure 4:
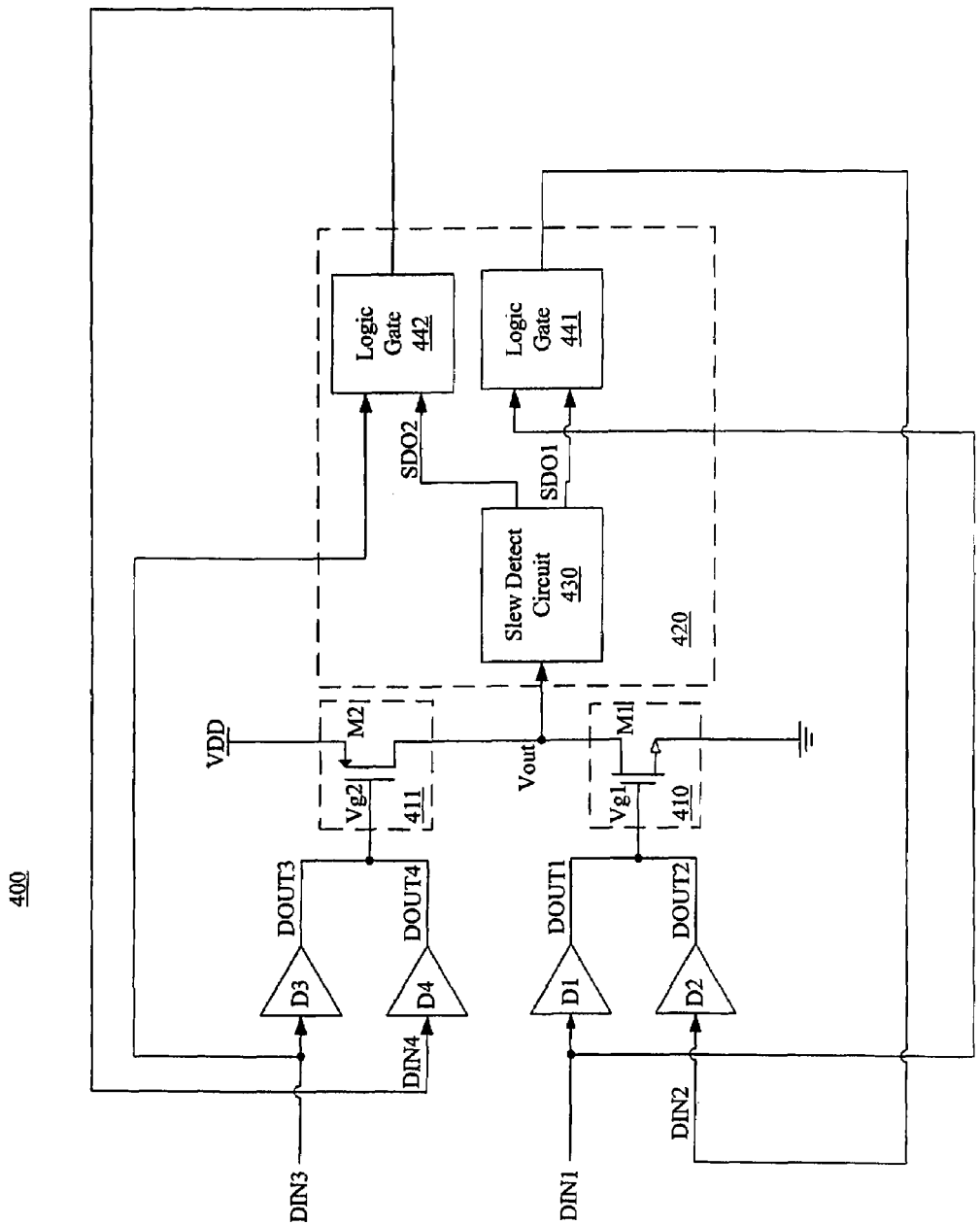
FIG. 4 illustrates a block diagram of an embodiment of the circuit of FIG. 1 that includes a power NMOSFET as a power switch and a power PMOSFET as another power switch.

FIG. 4 illustrates a block diagram of an embodiment of circuit 400, which may be employed as an embodiment of circuit 200 of FIG. 2. Circuit 400 further includes driver D3, driver D4, and power switch 411. Power switch 411 includes power MOSFET M2. Strong driver control circuit 420 further includes logic gate 442.

In one embodiment, signal DIN1 and signal DIN3 are the same signal. In another embodiment, signal DIN1 and signal DIN3 are substantially the same except slightly different timing in order to ensure break-before-make between power switch 410 and power switch 411. In one embodiment, driver D3 and D4 may be omitted, and drivers D1 and D2 may be used to drive M2 as well as M1. However, they may also be included, as shown, to provide break-before-make. The gate voltage of power MOSFET M1 is Vg1, and the gate voltage of power MOSFET M2 is Vg2.

Figure 5:
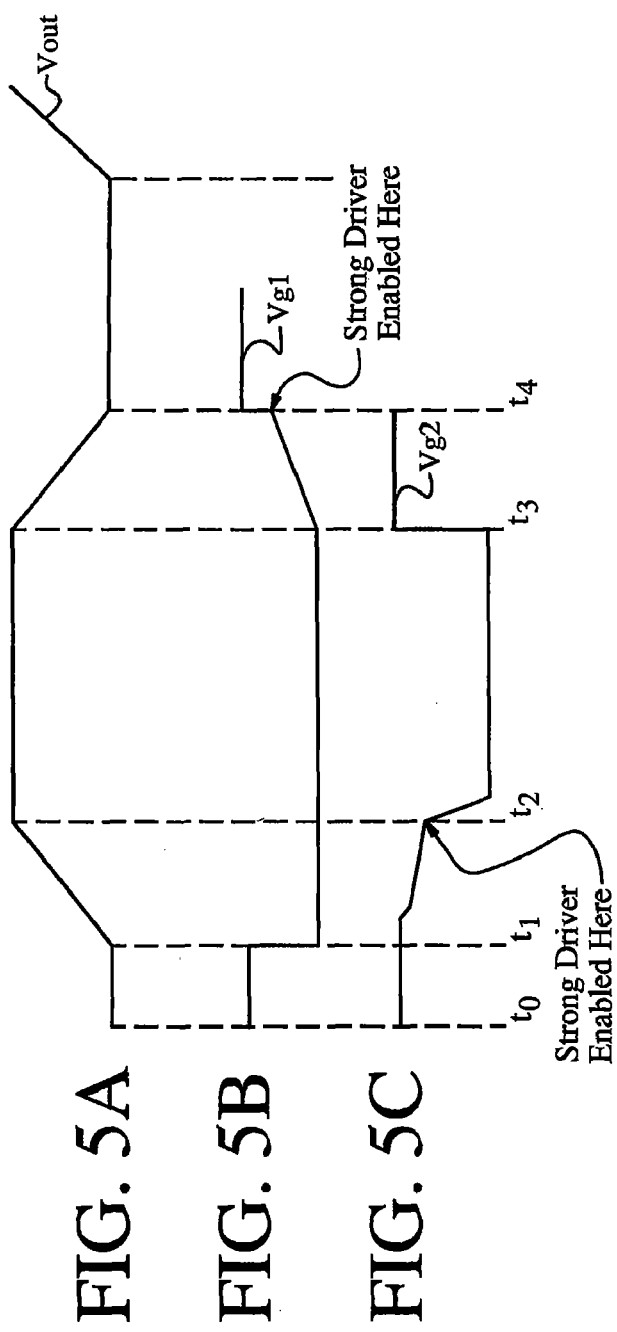
FIGS. 5A-5C show timing diagrams of waveforms of embodiments of signals for an embodiment of the circuit of FIG. 4.

FIGS. 5A-5C show timing diagrams of waveforms of embodiments of output voltage Vout, voltage Vg1, and voltage Vg2, respectively, of an embodiment of circuit 400 of FIG. 4.

At time t0, signals DIN1 and DIN2 are high, signals DOUT1 and DOUT2 are high, and voltages Vg1 and Vg2 are high. Accordingly, power MOSFET M2 is open. Power MOSFET M1 is closed, driven by both driver D1 and driver D2. Since power MOSFET M1 is closed and power MOSFET M2 is open, output voltage Vout is 0V. At time t1, signal DIN1 changes from high to low, causing DIN2 to change from high to low, and causing voltage Vg1 to go low, turning power MOSFET M1 off. After a small non-overlap, signal DIN3 also changes from high to low. Accordingly, signal DOUT3 changes from Vdd to Vdd-Vtp, and driver D3 begins driving M2 on. However, strong driver control circuit 420 provides signal DIN4 so that signal DIN4 is high. Accordingly, only driver D3 is driving power MOSFET M2 when signal DIN3 first changes from high to low. Accordingly, as shown in FIG. 5C, voltage Vg2 begins transitioning to low relatively slowly. This causes Vout to transition from 0V to VDD relatively slowly.

Output voltage Vout approximately reaches VDD at time t2. At this time, signal SDO2 is asserted, which in turns causes logic gate 442 to change signal DIN4 to low. Accordingly, driver D4 also drives power MOSFET M2, which causes voltage Vg2 to go relatively quickly to 0V.

At time t3, signal DIN3 changes from low to high, causing signal DIN4 to change from low to high, causing voltage Vg2 to go high, turning power MOSFET M2 off. After a small non-overlap, signal DIN1 also changes from low to high. Accordingly, signal DOUT1 changes from 0 V to Vtn, and driver D1 begins driving M1 on. However, strong driver control circuit 420 provides signal DIN2 so that signal DIN2 is low. Accordingly, only driver D1 is driving power MOSFET M1 when signal DIN1 first changes from low to high. Accordingly, as shown in FIG. 5B, voltage Vg1 begins transitioning to high relatively slowly. This causes Vout to transition from VDD to 0V relatively slowly.

Output voltage Vout approximately reaches 0V at time t4. At this time, signal SDO1 is asserted, which in turns causes logic gate 441 to change signal DIN2 to high. Accordingly, driver D2 also drives power MOSFET M1, which causes voltage Vg1 to go relatively quickly to VDD.

FIG. 5A illustrates a slowed rising edge in Vout from time t1 to time t2, and a slowed falling edge in Vout from time t3 to time t4.

Figure 6:
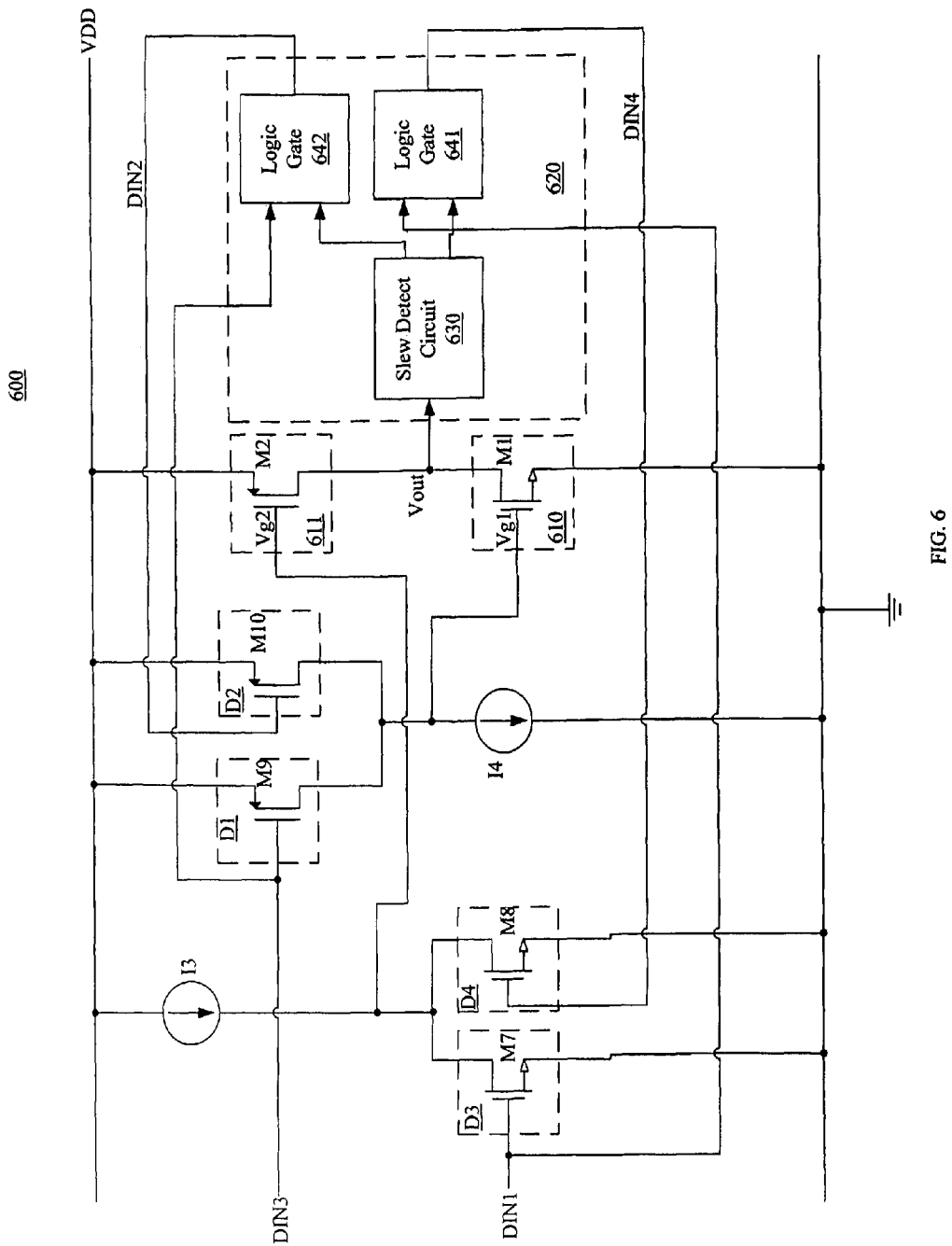
FIG. 6 illustrates a block diagram of an embodiment of the circuit of FIG. 4.

FIG. 6 illustrates a block diagram of an embodiment of circuit 600, which may be employed as an embodiment of circuit 400 of FIG. 4. Circuit 600 further includes currents source I3 and current sink I4. Driver D1 includes transistor M9, driver D2 includes transistor M10, driver D3 includes transistor M7, and driver D4 includes transistor M8.

Figure 11:
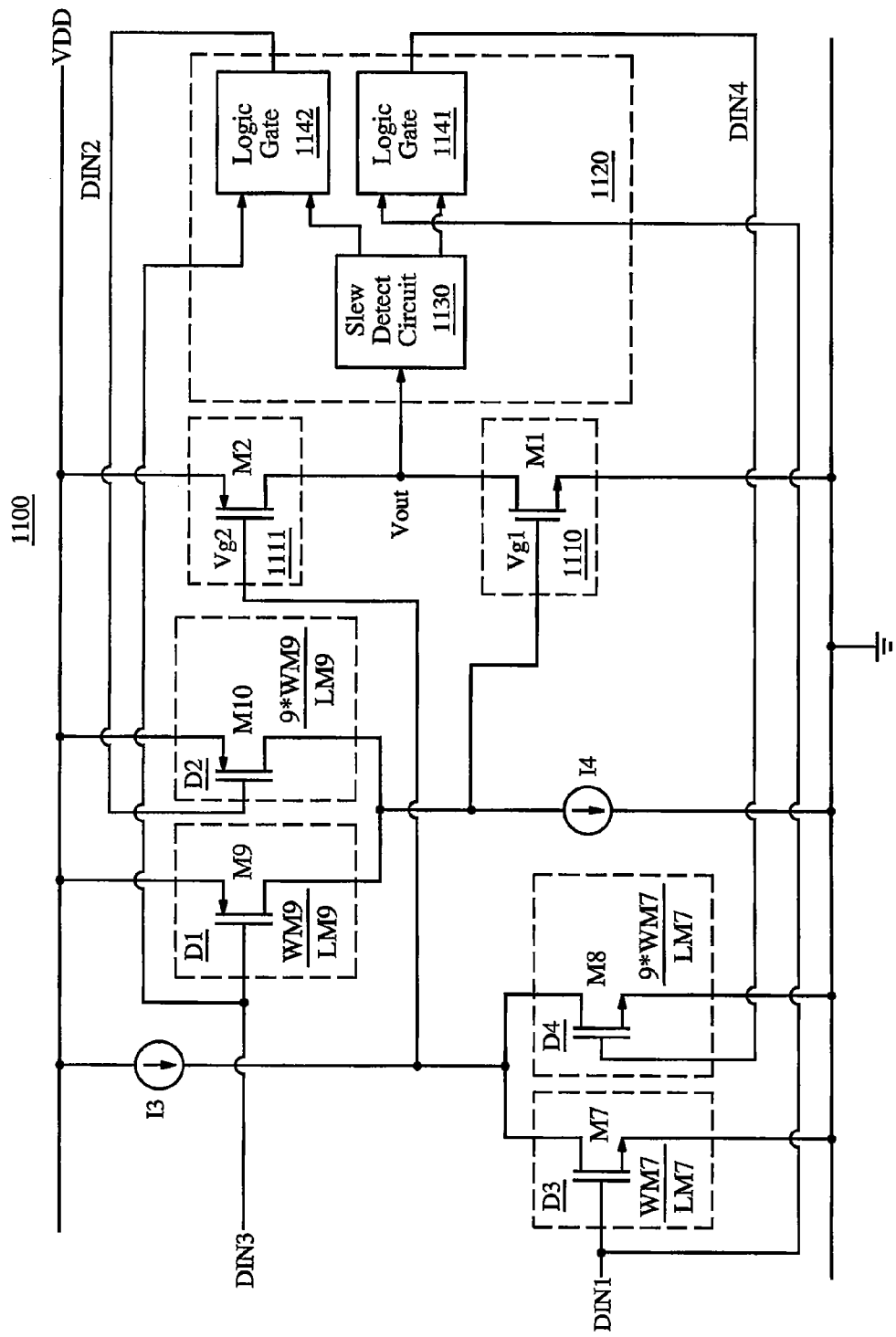
FIG. 11 shows a block diagram of an embodiment of the circuit of FIG. 6.

In one embodiment, transistors M10 and M8 are strong drivers, whereas transistors M7 and M9 are weak drivers. In this embodiment, transistors M10 and M8 may each have several times larger W/L ratios than those of transistor M7 and transistor M9. As discussed above with regard to FIG. 2, only driver D1 is driving power MOSFET M1 when signal DIN1 first changes from low to high. This causes Vout to transition from VDD to 0V relatively slowly. For example, in one embodiment, this falling edge in signal Vout occurs over about ten nanoseconds, whereas the falling edge would occur in less than one nanosecond if both driver D1 and driver D2 were driving power MOSFET M1 during the falling edge. This entails that, in this particular embodiment, driver D2 is about nine times stronger than driver D1, with the combined strength of driver D1 and D2 being ten times the strength of D1 alone. In embodiments in which the drivers are transistors as shown in FIG. 6, and which the drivers have different drive strengths based on their different W/L ratios as discussed above, this entails that, in this particular embodiment, the W/L ratio of transistor M10 is nine times the W/L ratio of transistor M9. Similarly, in this particular embodiment, the W/L ratio of M8 is nine times the W/L ratio of M7. This is illustrated in FIG. 11 in one embodiment.

Figure 7:
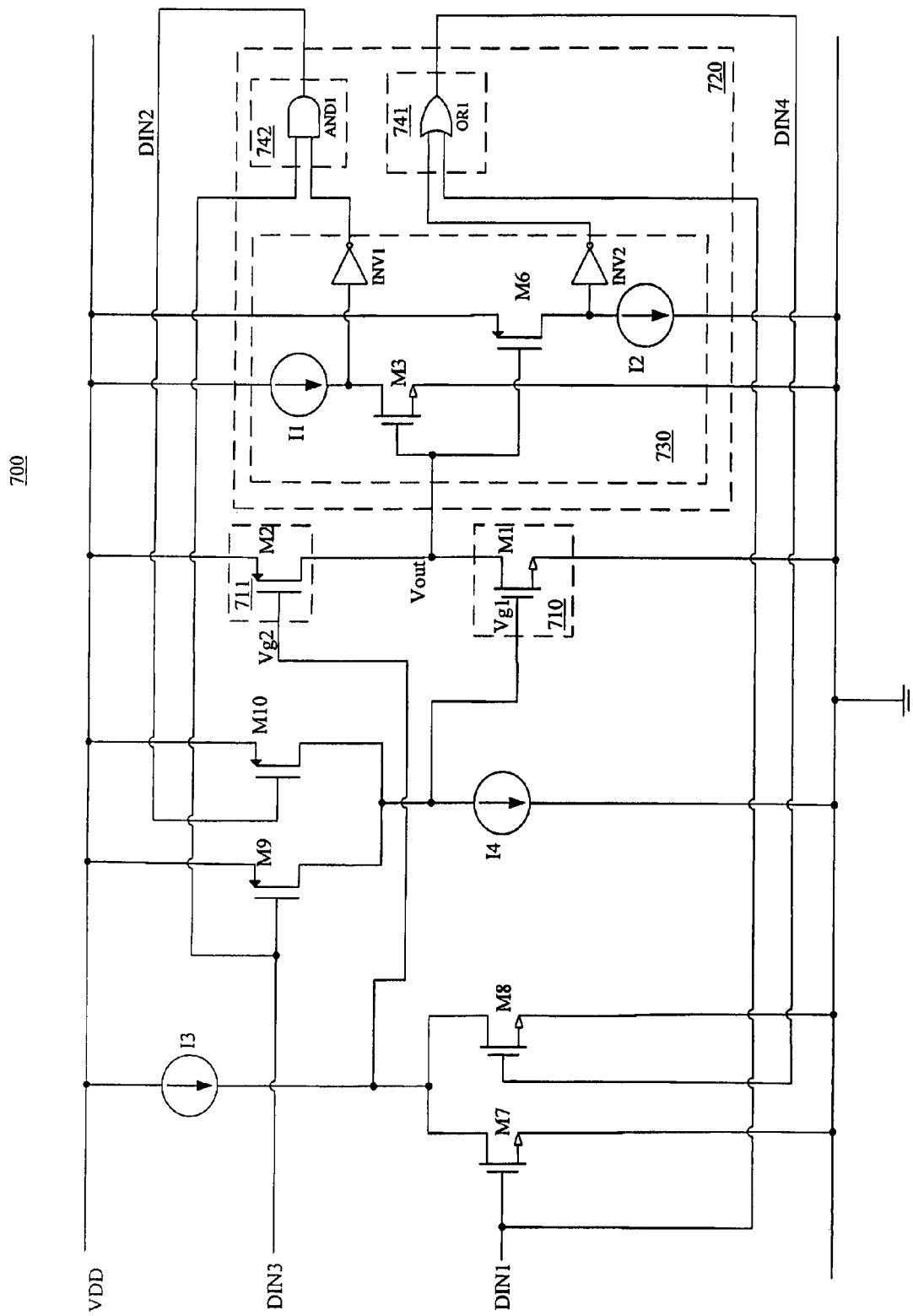
FIG. 7 shows a block diagram of an embodiment of the circuit of FIG. 6.

FIG. 7 shows a block diagram of an embodiment of circuit 700, which may be employed as an embodiment of circuit 600 of FIG. 6. Logic gate 742 includes AND gate AND1. Logic gate 741 includes OR gate OR1. Slew detect circuit 730 includes current source I1, current sink I2, transistor M3, transistor M6, inverter INV1, and inverter INV2. In some embodiments, inverters INV1 and INV2 may be omitted depending on the logic, so that the drain of transistor M3 is connected directly to logic gate 742, and the drain of transistor M6 is connected directly to logic gate 741. In either case it may be said that the drain of transistor M3 is coupled to logic gate 742, whether it is connected directly to logic gate 742 or coupled to logic gate 742 via inverter INV1.

Figure 13:
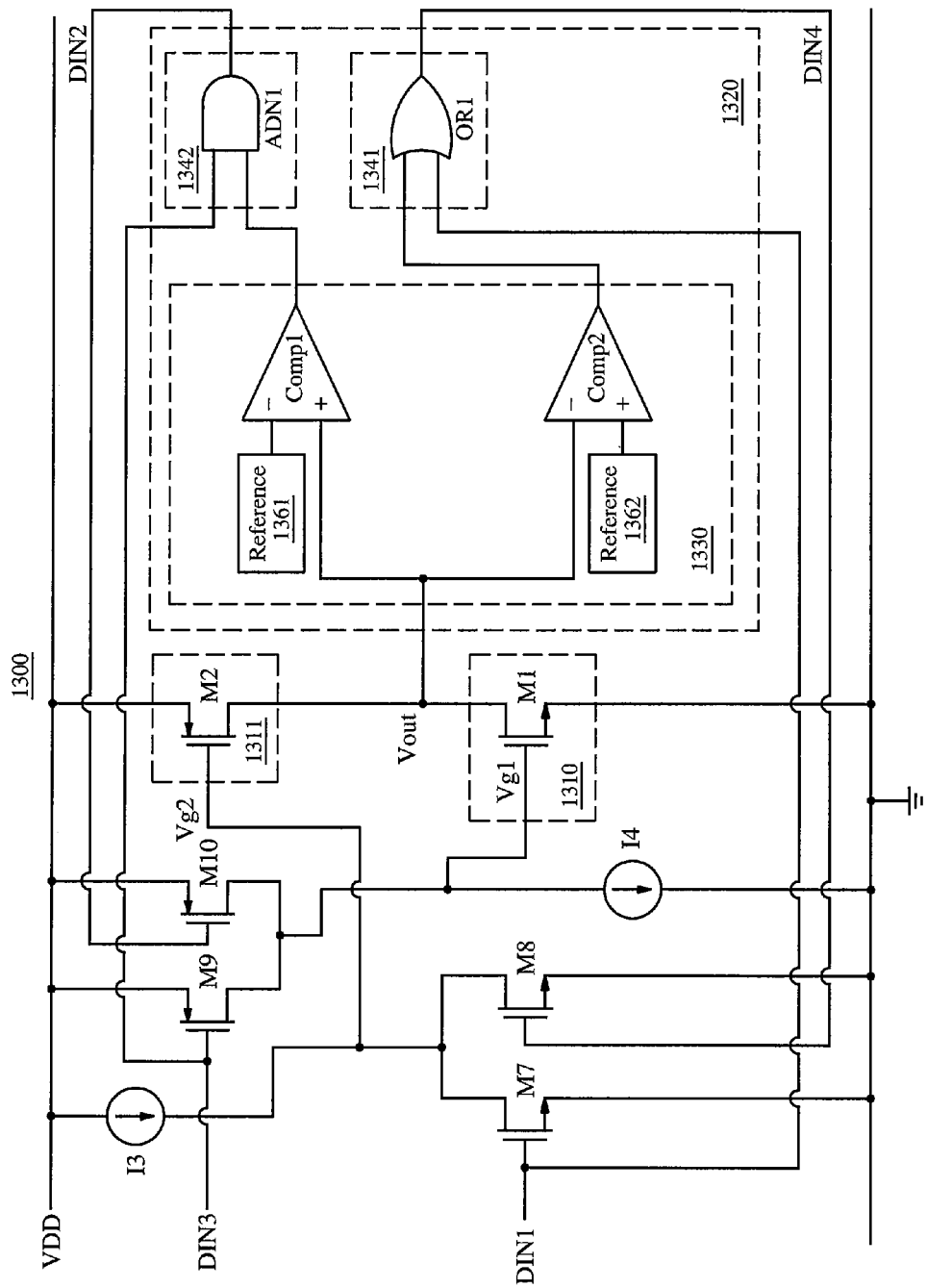
FIG. 13 illustrates a block diagram of an embodiment of the circuit of FIG. 7, arranged in accordance with aspects of the present invention.

Although FIG. 7 illustrates one embodiment of slew detect circuit 730, other embodiments of a slew detect circuit may be employed in other embodiments. For example, in one embodiment, the slew detect circuit may instead include comparators which compare Vout to reference values (as shown in FIG. 13 in one embodiment).

Figure 8:
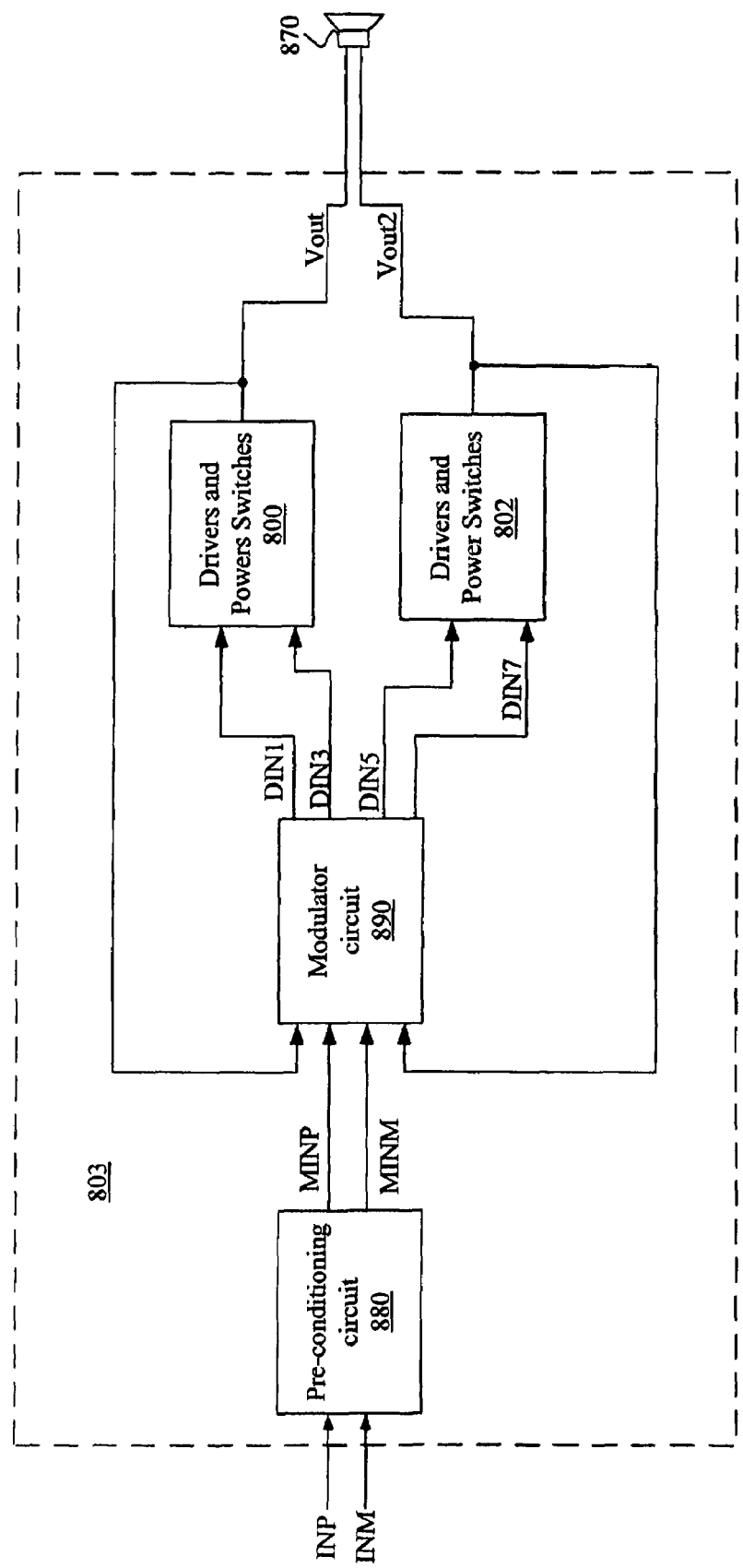
FIG. 8 illustrates a block diagram of an embodiment of a class D amplifier that includes an embodiment of the circuit of FIG. 4.

FIG. 8 illustrates a block diagram of an embodiment of class D amplifier 803 and speaker 870. Class D amplifier 803 includes pre-conditioning circuit 880, modulator circuit 890, drivers and power switches 800, and drivers and power switches 802. Drivers and power switches 800 is an embodiment of circuit 400 of FIG. 4. Similarly, drivers and power switches 802 may be an embodiment of circuit 400 of FIG. 4. The power transistors in drivers and power switches 800 and drivers and power switch 801 (e.g. power MOSFETs M1 and M2) form a class D output stage.

In operation, pre-conditioning circuit 880 provides signals MINP and MINM from audio input signal INP and INM. Pre-conditioning circuit 880 may provide low-pass filtering and/or other pre-conditioning functions.

Modulator circuit 890 is arranged to provide signal DIN1, DIN3, DIN5, and DIN7 based on signals MINP and MINM, and further based on feedback from signals Vout and Vout2. Modulator circuit 890 employs either pulse-width modulation, pulse density modulation, or sigma-delta modulation. A relatively high frequency carrier signal is modulated by the relatively low frequency audio input signal. As previously discussed, signal DIN1 and DIN3 may be substantially the same signal except for break-before-make timing. Also, signal DIN5 and DIN7 may be substantially the same signal except for break-before-make timing.

Drivers and Power Switches 800 provide voltage Vout from signal DIN1 and DIN3, and Drivers and Power Switches 802 provide voltage Vout2 from signal DIN5 and signal DIN7. Drivers and Power Switches 800 provides weaker driving of the power switch on edges of voltage Vout to slow the edges to reduce EMI, but provide normal drive strength when output edges are not occurring. This way, EMI is significantly reduced, but Rdson, efficiency, THD (total harmonic distortion), PSRR (power supply rejection ratio), and other audio specifications are not adversely affected.

Unlike most class D amplifiers, class D amplifier 803 does not require a low-pass filter at the output. In one embodiment, because driver and power switches 800 and driver and power switches 802 reduce the speed of output edges such that EMI is significantly reduced, lower-pass filtering of the class D output is unnecessary.

Although one embodiment of a class D amplifier is illustrates in FIG. 8, many variations of the class D amplifier are within the scope and spirit of the invention. For example, although speaker 870 is shown in a bridge-tied load configuration in FIG. 8, in other embodiments, signals 870 may be arranged in a single-ended configuration. Also, pre-conditioning circuit 880 is an optional component that need not be included in class D amplifier 803. In other embodiments, the audio input signal may go directly to modulator circuit 890. These embodiments and others are within the scope and spirit of the invention.

Figure 9:
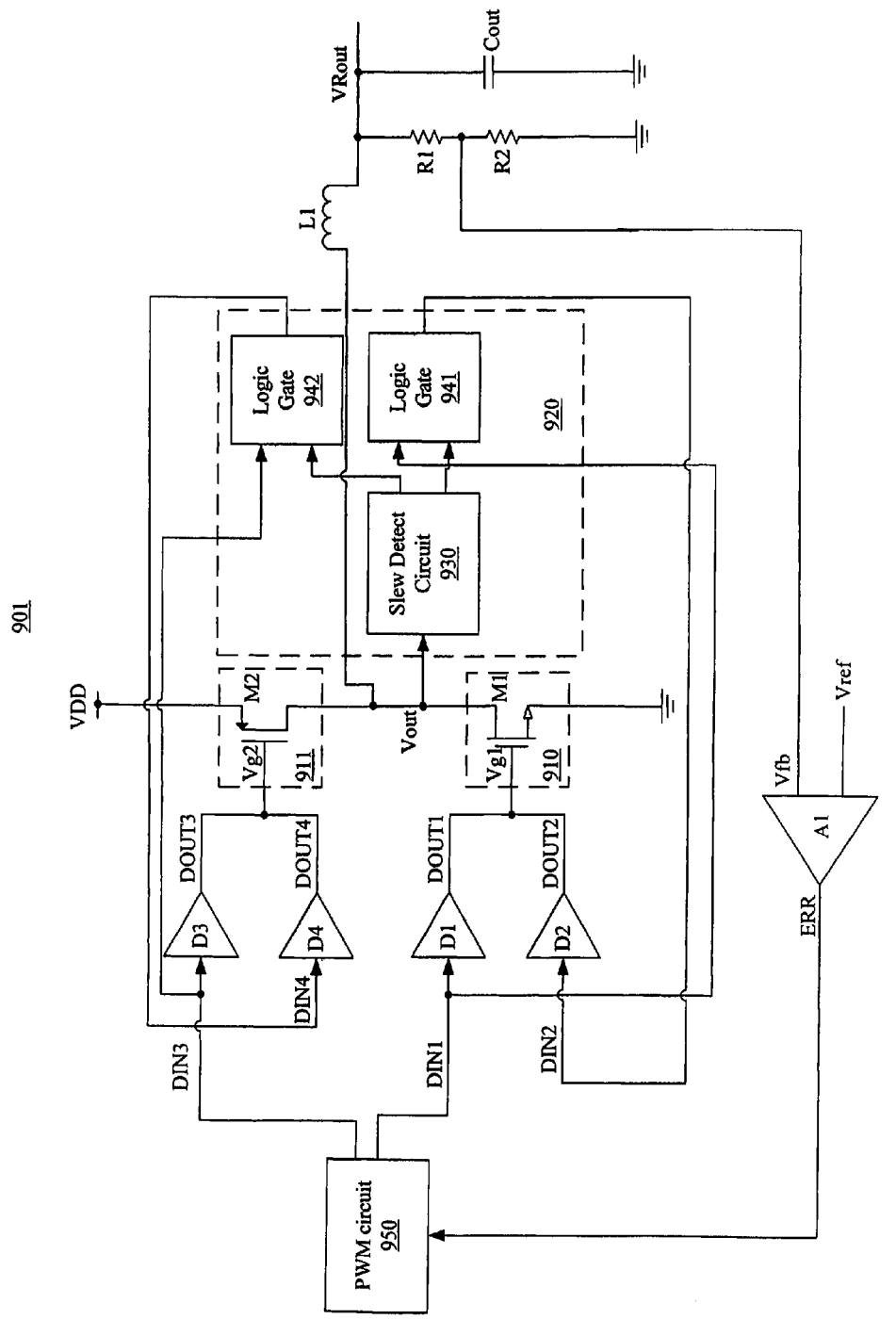
FIG. 9 shows a block diagram of a switching regulator that includes the circuit of FIG. 4.

FIG. 9 shows a block diagram of switching regulator 901, which includes an embodiment of circuit 400 of FIG. 4. Switching regulator 901 further includes inductor L1, resistor R1, resistor R2, capacitor Cout, error amplifier A1, and PWM (pulse width modulation) circuit 950.

In operation, switching regulator 901 provides regulated output voltage VRout. Resistor R1 and resistor R2 operate together as a voltage divider to provide feedback voltage Vfb. Error amplifier A1 is arranged to provide error signal ERR from feedback voltage Vfb and reference voltage Vref. PWM circuit 950 is arranged to provide signals DIN1 and DIN3 by pulse width modulating error signal ERR.

FIG. 9 shows one embodiment of a PWM voltage mode buck, inductor-based, synchronously-rectified regulator. However, virtually any type of switching regulator may be employed, such a buck, boost, or buck/boost; inductor or switched capacitor based; voltage mode or current mode; PWM, COT (constant on-time), or hysteretic; synchronously-rectified or asynchronously-rectified; or the like. These embodiments and other are within the scope and spirit of the invention. The invention is not limited to use in switching regulators, which is provided by way of example only. Embodiments of the invention may be used in virtually any application in which power switching is employed with relatively fast output edges. For examples, FIG. 8 above illustrates an embodiment of a class D amplifier in which an embodiment of the invention may be employed.

FIGS. 10A-C illustrates timing diagrams of waveforms of embodiments of output voltage Vout, voltage Vg1, and voltage Vg2, respectively, of the timing diagrams of FIGS. 5A-C. In the embodiments shown, the rising edge of Vout, which occurs between time t1 and t2, is 10 ns. Also illustrated in the embodiment shown is that Vout transitions from 0V to VDD, as discussed previously with regard to FIGS. 5A-C.

FIG. 11 shows a block diagram of an embodiment of the circuit 100, which may be employed as an embodiment of circuit of FIG. 6. In FIG. 11, certain W/L ratios are shown as discussed above with regard to a particular embodiment of the circuit of FIG. 6.

FIG. 12 shows a timing diagram of a waveform of an embodiment voltage Vout of FIG. 5A. FIG. 12 illustrates an embodiment of Vout in which, as discussed above for a particular embodiment of circuit 100 of FIG. 1, for a rising edge in output voltage Vout, driver D2 begins driving power switch 110 also when Vout reaches a voltage that is relatively close to VDD (e.g. VDD-300 mV, as shown in FIG. 12), and for a falling edge, driver D2 begins driving power switch 110 also when Vout reaches a voltage that is relatively close to 0V (e.g. 300 mV, as shown in FIG. 12).

FIG. 13 illustrates a block diagram of an embodiment of the circuit of FIG. 7, in which slew detect circuit 1330 includes comparator Comp1, comparator Comp2, reference 1361, and reference 1362.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for a switching output, comprising:
   a first driver that is arranged to drive a power switch, wherein the first driver is arranged to begin to turn on the power switch if a first driver input signal changes from a first logic level to a second logic level, such that beginning to turn on the power switch causes an output voltage that is associated with the power switch to move toward a first pre-determined voltage level, wherein the first pre-determined level is reached when an edge of the output voltage is complete or approximately complete;
   a second driver that is arranged to drive the power switch;
   a slew detect circuit that is arranged to assert a slew detect circuit output signal when the output voltage reaches the first pre-determined level, wherein the slew detect circuit is arranged such that:
   if the first driver input signal corresponds to the second logic level:
      the second driver does not drive the power switch if the slew detect circuit output signal is unasserted, and the second driver drives the power switch if the slew detect circuit output signal is asserted; and
   a current source, wherein the first driver includes a first transistor that is coupled to the current source, and wherein the second driver includes second transistor that is coupled to the current source; wherein the first transistor has a first width-to-length (W/L) ratio, the second transistor has a second W/L ratio, and wherein the second W/L ratio is at least five times as great as the first W/L ratio.

2. The circuit of claim 1, further comprising:
   a third driver that is arranged to drive another power switch, wherein the third driver is arranged to begin to turning on said another power switch if a third driver input signal changes from a third logic level to a fourth logic level, such that beginning to turn on said another power switch causes the output voltage to move toward a second pre-determined voltage level;
   a fourth driver that is arranged to drive said another power switch; and
   wherein the slew detect circuit is further arranged to assert a second slew detect circuit output signal when the output voltage reaches the second pre-determined level, wherein the slew detect circuit is further arranged such that:
   if the third driver input signal corresponds to the fourth logic level:
      the fourth driver does not drive said another power switch if the second slew detect circuit output signal is unasserted, and the fourth driver drives said another power switch if the second slew detect circuit output signal is asserted.

3. A circuit for a switching output, comprising:
a first driver that is arranged to drive a power switch, wherein the first driver is arranged to begin to turn on the power switch if a first driver input signal changes from a first logic level to a second logic level, such that beginning to turn on the power switch causes an output voltage that is associated with the power switch to move toward a first pre-determined voltage level, wherein the first pre-determined level is reached when an edge of the output voltage is complete or approximately complete;
a second driver that is arranged to drive the power switch;
a slew detect circuit that is arranged to assert a slew detect circuit output signal when the output voltage reaches the first pre-determined level, wherein the slew detect circuit is arranged such that:
if the first driver input signal corresponds to the second logic level:
the second driver does not drive the power switch if the slew detect circuit output signal is unasserted, and the second driver drives the power switch if the slew detect circuit-output signal is asserted;
a third driver that is arranged to drive another power switch, wherein the third driver is arranged to begin to turning on said another power switch if a third driver input signal changes from a third logic level to a fourth logic level, such that beginning to turn on said another power switch causes the output voltage to move toward a second pre-determined voltage level; and
a fourth driver that is arranged to drive said another power switch;
wherein the slew detect circuit is further arranged to assert a second slew detect circuit output signal when the output voltage reaches the second pre-determined level, wherein the slew detect circuit is further arranged such that:
if the third driver input signal corresponds to the fourth logic level:
the fourth driver does not drive said another power switch if the second slew detect circuit output signal is unasserted, and the fourth driver drives said another power switch if the second slew detect circuit output signal is asserted wherein the first, second, third, and fourth drivers are sized such that: rising edges in the output voltage occur over at least eight nanoseconds, falling edges in the output voltage occur over at least eight nanoseconds, a drive strength of the second driver is at least eight times as strong as a drive strength of the first driver, and a drive strength of the fourth driver is at least eight times as strong as a driver strength of the third driver.

4. A circuit for a switching output, comprising:
a first driver that is arranged to drive a power switch, wherein the first driver is arranged to begin to turn on the power switch if a first driver input signal changes from a first logic level to a second logic level, such that beginning to turn on the power switch causes an output voltage that is associated with the power switch to move toward a first pre-determined voltage level, wherein the first pre-determined level is reached when an edge of the output voltage is complete or approximately complete;
a second driver that is arranged to drive the power switch;
a slew detect circuit that is arranged to assert a slew detect circuit output signal when the output voltage reaches the first pre-determined level, wherein the slew detect circuit is arranged such that:
if the first driver input signal corresponds to the second logic level:
the second driver does not drive the power switch if the slew detect circuit output signal is unasserted, and the second driver drives the power switch if the slew detect circuit output signal is asserted;
a third driver that is arranged to drive another power switch, wherein the third driver is arranged to begin to turning on said another power switch if a third driver input signal changes from a third logic level to a fourth logic level, such that beginning to turn on said another power switch causes the output voltage to move toward a second pre-determined voltage level;
a fourth driver that is arranged to drive said another power switch;
a pre-conditioning circuit having at least an input that is arranged to receive an audio input signal, and an output, wherein the first driver has at least an input, and wherein the third driver has at least an input;
a modulator circuit that includes at least one of a pulse width modulation circuit, a pulse density modulation circuit, or a sigma-delta modulation circuit, wherein the modulator circuit has at least an input that is coupled to the output of the pre-conditioning circuit, a first output that is coupled to the input of the first driver, and a second output that is coupled to the input of the third driver; and
a class D output stage that includes the power switch and said another power switch, wherein the output voltage is a class D output voltage of the class D output stage.

5. A circuit for a switching output, comprising:
a first driver that is arranged to drive a power switch, wherein the first driver is arranged to begin to turn on the power switch if a first driver input signal changes from a first logic level to a second logic level, such that beginning to turn on the power switch causes an output voltage that is associated with the power switch to move toward a first pre-determined voltage level;
a second driver that is arranged to drive the power switch; and
a slew detect circuit that is arranged to assert a slew detect circuit output signal when the output voltage reaches the first pre-determined level, wherein the slew detect circuit is arranged such that:
if the first driver input signal corresponds to the second logic level:
the second driver does not drive the power switch if the slew detect circuit output signal is unasserted, and the second driver drives the power switch if the slew detect circuit output signal is asserted;
a third driver that is arranged to drive another power switch, wherein the third driver is arranged to begin to turning on said another power switch if a third driver input signal changes from a third logic level to a fourth logic level, such that beginning to turn on said another power switch causes the output voltage to move toward a second pre-determined voltage level;
a fourth driver that is arranged to drive said another power switch,
wherein the slew detect circuit is further arranged to assert a second slew detect circuit output signal when the output voltage reaches the second pre-determined level, wherein the slew detect circuit is further arranged such that:
if the third driver input signal corresponds to the fourth logic level:

the fourth driver does not drive said another power switch if the second slew detect circuit output signal is unasserted, and the fourth driver drives said another power switch if the second slew detect circuit output signal is asserted;
a modulator circuit that includes at least one of a pulse width modulation circuit, a pulse density modulation circuit, or a sigma-delta modulation circuit, wherein the modulator circuit has at least an input that is arranged to receive an audio input signal, a first output that is coupled to the input of the first driver, and a second output that is coupled to the input of the third driver; and
a class D output stage that includes the power switch and said another power switch, wherein the output voltage is a class D output voltage of the class D output stage.

6. The circuit of claim 5, wherein the slew detect circuit includes a comparator and a reference.

7. The circuit of claim 5, wherein the slew detect circuit includes:
a transistor having at least a gate, a drain, and a source, wherein the gate of the transistor is arranged to receive the output voltage; and
a current source that is coupled to the drain of the transistor.

8. The circuit of claim 7, further comprising a logic gate having at least a first input, a second input, and an output, wherein the first driver has at least an input and an output, the first driver is arranged to receive the first driver input signal at the input of the first driver, the second driver has at least an input and an output, the output of the first driver is coupled to the output of the second driver, the first input of the logic gate is coupled to the input of the first driver, the second input of the logic gate is coupled to the drain of the transistor, and wherein the output of the logic gate is coupled to the input of the second driver.

9. The circuit of claim 5, further comprising a current source, wherein the first driver includes a first transistor that is coupled to the current source, and wherein the second driver includes second transistor that is coupled to the current source.

10. The circuit of claim 5, wherein the slew detect circuit includes:
a first transistor having at least a gate, a drain, and a source, wherein the gate of the first transistor is arranged to receive the output voltage; and
a first current source that is coupled to the drain of the first transistor;
a second transistor having at least a gate, a drain, and a source, wherein the gate of the second transistor is coupled to the gate of the first transistor; and
a second current source that is coupled to the drain of the second transistor.

11. The circuit of claim 10, further comprising:
a first logic gate having at least a first input, a second input, and an output, wherein the first, second, third, and fourth drivers each have at least an input and an output; the first input of the first logic gate is arranged to receive the first driver input signal; the first input of the first logic gate is coupled to the input of the first driver; the second input of the first logic gate is coupled to the drain of the first transistor; and wherein the output of the first logic gate is coupled to the input of second driver; and
a second logic gate having at least a first input, a second input, and an output, wherein the first input of the second logic gate is coupled to the input of the third driver; the second input of the second logic gate is coupled to the drain of the second transistor; and wherein the output of the second logic gate is coupled to the input of the fourth driver.

12. The circuit of claim 5, wherein the first pre-determined voltage is ground, and wherein the second pre-determined voltage is VDD.

13. The circuit of claim 5, wherein the first pre-determined voltage is a voltage that is slightly greater than ground, and wherein the second pre-determined voltage is a voltage that is slightly less than VDD.

14. The circuit of claim 13, wherein the first pre-determined voltage is in a range of about 1 mV to about 600 mV, and wherein the second pre-determined voltage is in a range of about VDD-600 mV to about VDD-1 mV.

15. A circuit for a switching output, comprising:
a power transistor having at least a gate, a drain, and a source;
a slew detect circuit having at least: an input that is coupled to the drain of the power transistor, and a first output;
a first driver having at least: a first input, and an output that is coupled to the gate of the power transistor;
a logic gate having at least a first input that is coupled to the input of the first driver, a second input that is coupled to the first output of the slew detect circuit, and an output;
a second driver having at least a first input that is coupled to the output of the logic gate, and an output that is coupled to the gate of the power transistor
another power transistor having at least a drain that is coupled to the drain of the power transistor, a gate, and a source;
a third driver having at least: a first input, and an output that is coupled to the gate of said another power transistor, wherein the slew detect circuit further has at least a second output;
another logic gate having at least a first input that is coupled to the input of the third driver, a second input that is coupled to the second output of the slew detect circuit, and an output;
a fourth driver having at least a first input that is coupled to the output of said another logic gate, and an output that is coupled to the gate of said another power transistor; and
a modulator circuit that includes at least one of a pulse width modulation circuit, a pulse density modulation circuit, or a sigma-delta modulation circuit, wherein the modulator circuit has at least a first output that is coupled to the input of the first driver, and a second output that is coupled to the input of the third driver; and wherein the power switch and said another power switch are arranged as a class D output stage.

16. The circuit of claim 15, wherein the slew detect circuit includes:
a third transistor having at least a gate, a drain, and a source, wherein the gate of the third transistor is coupled to the drain of the power transistor;
a first current source that is coupled to the drain of the third transistor, wherein the second input of the logic gate is coupled to the drain of the third transistor;
a fourth transistor having at least a gate, a drain, and a source, wherein the gate of the fourth transistor is coupled to the drain of the power transistor; and
a second current source that is coupled to the drain of the fourth transistor, wherein the second input of said another logic gate is coupled to the drain of the fourth transistor.

* * * * *

UNITED STATES PATENT AND TRADEMARK OFFICE
CERTIFICATE OF CORRECTION

PATENT NO.            : 7,710,168 B2
APPLICATION NO. : 11/893879
DATED                     : May 4, 2010
INVENTOR(S)         : Sumant Bapat It is certified that error appears in the above-identified patent and that said Letters Patent is hereby corrected as shown below:

In column 3, line 46, delete "DIM1" and insert -- DIN1 --, therefor.

In column 4, line 62, delete "0 V" and insert -- 0V --, therefor.

In column 5, line 49, delete "0 V" and insert -- 0V --, therefor.

In column 9, line 21, in claim 3, delete "circuit-output" and insert -- circuit output --, therefor.

Signed and Sealed this

Second Day of November, 2010

David J. Kappos
*Director of the United States Patent and Trademark Office*